United States Patent
Storli

(10) Patent No.: US 7,218,003 B2
(45) Date of Patent: May 15, 2007

(54) METHODS FOR WAFER-LEVEL PACKAGING OF MICROELECTRONIC DEVICES AND MICROELECTRONIC DEVICES FORMED BY SUCH METHODS

(75) Inventor: Farrah J. Storli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/090,092

(22) Filed: Mar. 24, 2005

(65) Prior Publication Data

US 2005/0167822 A1    Aug. 4, 2005

Related U.S. Application Data

(63) Continuation of application No. 10/230,459, filed on Aug. 29, 2002, now Pat. No. 6,885,101.

(51) Int. Cl.
*H01L 23/52* (2006.01)
*H01L 23/48* (2006.01)
*H01L 29/40* (2006.01)
*H01L 23/485* (2006.01)
*H01L 23/498* (2006.01)

(52) U.S. Cl. ............ 257/737; 257/738; 257/779; 257/780; 257/E23.069; 257/E23.021; 438/612; 438/613; 438/108

(58) Field of Classification Search ........ 257/737–738, 257/701, E23.021, E23.069, 779–780; 438/108, 438/612–613
See application file for complete search history.

(56) References Cited

U.S. PATENT DOCUMENTS

| 5,518,957 A | 5/1996 | Kim |
| 5,682,065 A | 10/1997 | Farnworth et al. |
| 5,851,845 A | 12/1998 | Wood et al. |
| 5,933,713 A | 8/1999 | Farnworth |

(Continued)

OTHER PUBLICATIONS

Ablestik Laboratories, RP-695-2E Material Safety Data Sheet, 6 pages, Nov. 6, 2002, Rancho Dominguez, California.

(Continued)

*Primary Examiner*—Luan Thai
(74) *Attorney, Agent, or Firm*—Perkins Coie LLP

(57) ABSTRACT

Methods for packaging microelectronic devices, microelectronic workpieces having packaged dies, and microelectronic devices. One aspect of the invention is directed toward a microelectronic workpiece comprising a substrate having a device side and a backside. In one embodiment, the microelectronic workpiece further includes a plurality of dies formed on the device side of the substrate, a dielectric layer over the dies, and a plurality of bond-pads on the dielectric layer. The dies have integrated circuitry and a plurality of bond-pads electrically coupled to the integrated circuitry. The ball-pads are arranged in ball-pad arrays over corresponding dies on the substrate. The ball-pads of one array, for example, are electrically coupled to the bond-pads of the corresponding die. The microelectronic workpiece of this embodiment further includes a protective film over the dielectric layer. In one embodiment, the workpiece further includes solder balls attached to corresponding ball-pads, and the protective film covers the dielectric layer in between the solder balls. The solder balls in this embodiment also have exposed contact sites such that the protective film can cover side portions of the solder balls but not a top surface of the solder balls.

25 Claims, 5 Drawing Sheets

U.S. PATENT DOCUMENTS

| | | | |
|---|---|---|---|
| 5,946,553 | A | 8/1999 | Wood et al. |
| 6,004,867 | A | 12/1999 | Kim et al. |
| 6,008,070 | A | 12/1999 | Farnworth |
| 6,020,624 | A | 2/2000 | Wood et al. |
| 6,023,094 | A | 2/2000 | Kao et al. |
| 6,072,236 | A | 6/2000 | Akram et al. |
| 6,075,290 | A | 6/2000 | Schaefer et al. |
| 6,124,634 | A | 9/2000 | Akram et al. |
| 6,184,465 | B1 | 2/2001 | Corisis |
| 6,187,615 | B1 | 2/2001 | Kim et al. |
| 6,194,250 | B1 * | 2/2001 | Melton et al. ............... 438/126 |
| 6,228,687 | B1 | 5/2001 | Akram et al. |
| 6,235,552 | B1 | 5/2001 | Kwon et al. |
| 6,242,931 | B1 | 6/2001 | Hembree et al. |
| 6,263,566 | B1 | 7/2001 | Hembree et al. |
| 6,271,469 | B1 * | 8/2001 | Ma et al. ................... 174/52.4 |
| 6,300,782 | B1 * | 10/2001 | Hembree et al. ........... 324/760 |
| 6,326,697 | B1 | 12/2001 | Farnworth |
| 6,326,698 | B1 | 12/2001 | Akram |
| 6,368,896 | B2 | 4/2002 | Farnworth et al. |
| 6,407,381 | B1 | 6/2002 | Glenn et al. |
| 6,441,473 | B1 * | 8/2002 | Deshmukh ................. 257/669 |
| 6,462,426 | B1 | 10/2002 | Kelkar et al. |
| 6,503,780 | B1 | 1/2003 | Glenn et al. |
| 6,552,423 | B2 * | 4/2003 | Song et al. ................. 257/679 |
| 6,560,122 | B2 | 5/2003 | Weber |
| 6,635,363 | B1 * | 10/2003 | Duclos et al. .............. 428/690 |
| 6,709,953 | B2 | 3/2004 | Vasquez et al. |
| RE38,789 | E | 9/2005 | Kao et al. |
| 2004/0041271 | A1 | 3/2004 | Storli |
| 2004/0042190 | A1 | 3/2004 | Eng et al. |
| 2005/0032294 | A1 | 2/2005 | Storli |

OTHER PUBLICATIONS

Ablestik Laboratories, RP-695-2E2 Material Safety Data Sheet, 6 pages, Dec. 3, 2002, Rancho Dominguez, California.

Ablestik Laboratories, Experimental Product RP-695-2E, Non-Conductive WBL Film for Die Encapsulation, 2 pages, Nov. 2002, Rancho Dominguez, California.

Ablestik Laboratories, Technical Data Sheet, Experimental Product RP-695-2E, Non-Conductive WBL Film for Die Encapsulation, 2 pages, Dec. 2002, Rancho Dominguez, California.

The Dow Chemical Company, "Processing Procedures for Dry-Etch CYCLOTENE Advanced Electronics Resins (Dry-Etch BCB)," Nov. 1997, Midland, MI, 8 pages.

The Dow Chemical Company, "BCB Properties," 1995-2002, http://www.dow.com/cyclotene/over.htm, accessed Jan. 8, 2003, 2 pages.

The Dow Chemical Company, "Bumping/Redistribution/Wafer Level Packaging (WLP)," 1995-2002, http://www.dow.com/cyclotene/apps/appl1.htm, accessed Jan. 8, 2003, 2 pages.

Lintec Corporation, ADWILL LE5950 Material Safety Data Sheet, 3 pages, Aug. 28, 2001, Tokyo, Japan.

* cited by examiner

METHODS FOR WAFER-LEVEL PACKAGING OF MICROELECTRONIC DEVICES AND MICROELECTRONIC DEVICES FORMED BY SUCH METHODS

This application is a continuation of U.S. application No. 10/230,459, entitled "METHODS FOR WAFER-LEVEL PACKAGING OF MICROELECTRONIC DEVICES AND MICROELECTRONIC DEVICES FORMED BY SUCH METHODS"filed Aug. 29, 2002, now U.S. Pat. No. 6,885, 101, issued Apr. 26, 2005, which is incorporated herein by reference in its entirety.

TECHNICAL FIELD

The present invention relates to packaging microelectronic devices and, in particular, methods for packaging such devices at the wafer level and microelectronic devices formed by such methods.

BACKGROUND

Microelectronic devices are used in cell phones, pagers, personal digital assistants, computers and many other products. A packaged microelectronic device can include a microelectronic die having integrated circuitry, an interposer substrate or lead frame attached to the die, and a molded casing around the die. The molded casing can also encase a portion of the interposer substrate or lead frame. The microelectronic die generally has a plurality of bond-pads coupled to the integrated circuitry. The bond-pads are coupled to terminals on the interposer substrate or the lead frame by small wire bonds. The interposer substrate can also include a plurality of ball-pads coupled to the terminals by traces in the interposer substrate. An array of solder-balls is configured so that each solder ball contacts a corresponding ball-pad to define a "ball-grid" array. Packaged microelectronic devices with ball-grid arrays generally have lower profiles and higher pin counts than conventional chip packages that use a lead frame.

Packaged microelectronic devices are typically made by (a) forming a plurality of dies on a semiconductor wafer, (b) cutting the wafer to singulate the dies, (c) attaching the individual dies to an interposer substrate or lead frame, (d) wire-bonding the bond-pads on the die to the terminals of the interposer substrate or lead frame, and (e) encapsulating the die with a molding compound. It is time consuming and expensive to mount individual dies to the interposer substrates or the lead frames. Also, it is time consuming and expensive to wire-bond the bond-pads to the terminals and then encapsulate the individual dies. Moreover, the handling processes for attaching individual dies to interposer substrates or lead frames may damage the bare dies. Packaging processes, therefore, have become a significant factor in producing semiconductor devices and other types of microelectronic devices.

Another process for packaging devices is wafer-level packaging. In wafer-level packaging, a plurality of dies are formed on a wafer, and then a redistribution layer is formed over the dies. The redistribution layer has a dielectric layer, a plurality of ball-pad arrays on the dielectric layer, and conductive traces in the dielectric layer that are coupled to individual ball-pads of the ball-pad arrays. Each ball-pad array is arranged over a corresponding die, and the ball-pads in an array are coupled to corresponding bond-pads of a die by the conductive traces. After forming the redistribution layer on the wafer, a highly accurate stenciling machine deposits discrete masses of solder paste onto the individual ball-pads. The solder paste is then reflowed to form small solder balls or "solder bumps" on the ball-pads. After forming the solder balls, the wafer is singulated to separate the individual microelectronic devices from one another.

Wafer level packaging is a promising development for reducing the cost of manufacturing microelectronic devices. By "pre-packaging" the individual dies with the redistribution layer before cutting the wafers to singulate the dies, sophisticated semiconductor processing techniques can be used to form smaller arrays of solder balls. Additionally, wafer-level packaging is an efficient process that simultaneously packages a plurality of dies to reduce costs and increase throughput.

Although wafer-level packaging offers many advantages, the process typically produces devices with exposed or "bare" dies. One concern of wafer-level packaged microelectronic devices is that the bare dies may be chipped or damaged in post-packaging processes. For example, the devices are often handled individually in JEDEC trays, test sockets and tape dispensers for post-packaging, testing and shipping. Another concern is that particles can become embedded in the redistribution layer during post-packaging processes. As a result, wafer-level packaged microelectronic devices may be damaged or rendered inoperative because of post-packaging handling.

SUMMARY

The present invention is directed toward methods for packaging microelectronic devices, microelectronic workpieces having packaged dies, and microelectronic devices. One aspect of the invention is directed toward a microelectronic workpiece comprising a substrate having a device side and a backside. In one embodiment, the microelectronic workpiece further includes a plurality of dies formed on the device side of the substrate, a dielectric layer over the dies, and a plurality of ball-pads on and/or in the dielectric layer. The dies have integrated circuitry and a plurality of bond-pads electrically coupled to the integrated circuitry. The ball-pads are arranged in ball-pad arrays over corresponding dies on the substrate. The ball-pads of one array, for example, are electrically coupled to the bond-pads of the corresponding die. The microelectronic workpiece of this embodiment further includes a protective film over the dielectric layer. In one embodiment, the workpiece further includes solder balls attached to corresponding ball-pads, and the protective film covers the dielectric layer in between the solder balls. The solder balls in this embodiment also have exposed contact sites such that the protective film does not completely cover the solder balls.

The protective film can be a material that is deformable at room temperatures or elevated temperatures. The protective film, for example, can be a material that is deformable at a temperature of 60° F. to 100° F., or from 60° C. to 100° C. The protective film can be cured to a non-deformable state at a higher temperature. In several embodiments, the protective film can have a thickness of approximately 10% to 95% of the height of the solder balls.

Another aspect of the invention is directed toward a microelectronic device comprising a substrate, a die formed on the substrate, and a plurality of ball-pads over the substrate. The die includes integrated circuitry and a plurality of bond-pads electrically coupled to the integrated circuitry. The ball-pads are arranged in a ball-pad array over the die, and the ball-pads are coupled to corresponding bond-pads over the die. The device further includes a plurality of solder elements on the ball-pads, and a cover over the dielectric layer and surrounding a portion of the solder elements. The solder elements, for example, can be solder bumps, and the cover can be a thin dielectric film that covers the dielectric layer and a lower portion of the solder elements. As a result, the solder elements can have exposed contact sites to provide the electrical connections to a printed circuit board.

Another aspect of the invention is directed toward a method for fabricating a microelectronic device. One embodiment of this aspect of the invention comprises fabricating a plurality of dies on a microelectronic workpiece and constructing a redistribution assembly on the workpiece before separating the dies. The dies can include integrated circuitry and bond-pads coupled to the integrated circuitry. The redistribution assembly can be constructed by depositing a dielectric layer over the dies, forming electrical traces in the dielectric layer that are connected to the bond-pads on the dies, and constructing arrays of ball-pads corresponding to the dies. The electrical traces couple the ball-pads of one array to the bond-pads of a corresponding die. This method can further include covering the dielectric layer with a protective film. The protective film, for example, can extend between solder balls on the ball-pads such that the solder balls have an exposed contact site. The protective film can be applied to the dielectric layer after attaching solder balls to the ball-pads by pressing the protective film against the dielectric layer and the solder balls. For example, a tape having a backing medium and a protective film on the backing medium can be rolled over the workpiece so that the protective film adheres to the dielectric layer and deforms around the solder balls. Similarly, a deformable protective film can be drawn against the workpiece using a vacuum to adhere the protective film to the dielectric layer and deform the protective film around the solder balls. In another embodiment, the protective film can be a liquid film that is deposited onto the dielectric layer and between the solder balls. In certain embodiments, the protective film can be etched or planarized to expose the upper portions of the solder balls for defining exposed contact sites.

DETAILED DESCRIPTION

The following disclosure describes several embodiments of microelectronic devices, microelectronic workpieces, and methods for manufacturing microelectronic devices and microelectronic workpieces. Many specific details of the invention are described below with reference to semiconductor devices. The term "workpiece," however, is used throughout to include any substrate upon which and/or in which microelectronic devices, micromechanical devices, data storage elements, read/write components, and other features are fabricated. For example, workpieces can be semiconductor wafers (e.g., silicon or gallium arsenide wafers), glass substrates, insulative substrates, and many other types of materials. The workpieces typically have very small, conductive lines, transistors, recesses and other components that form integrated circuitry. Many components of the integrated circuitry are sub-micron features with dimensions less than 1.0 µm, such as in the range of 0.1–0.5 µm. Several embodiments in accordance with the invention are set forth in FIGS. 1A–4 and the following text to provide a thorough understanding of particular embodiments of the invention. A person skilled in the art will understand, however, that the invention may have other embodiments that might include more or fewer elements than those shown and described with reference to the embodiments of FIGS. 1A–4.

Figure 1A:
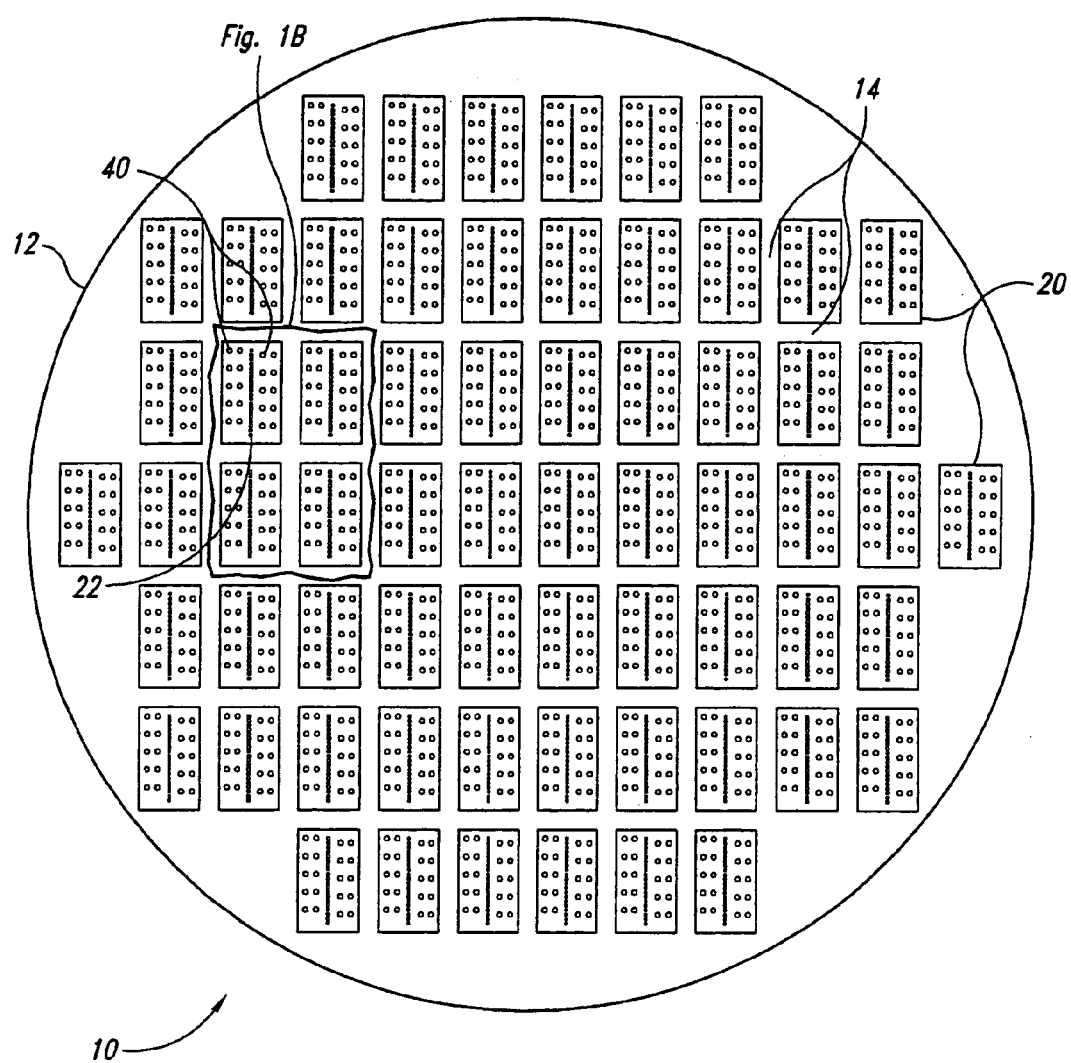
FIG. 1A is a top plan view of a complete workpiece with a plurality of dies at one stage of manufacturing a microelectronic device in accordance with an embodiment of the invention.
Figure 1B:
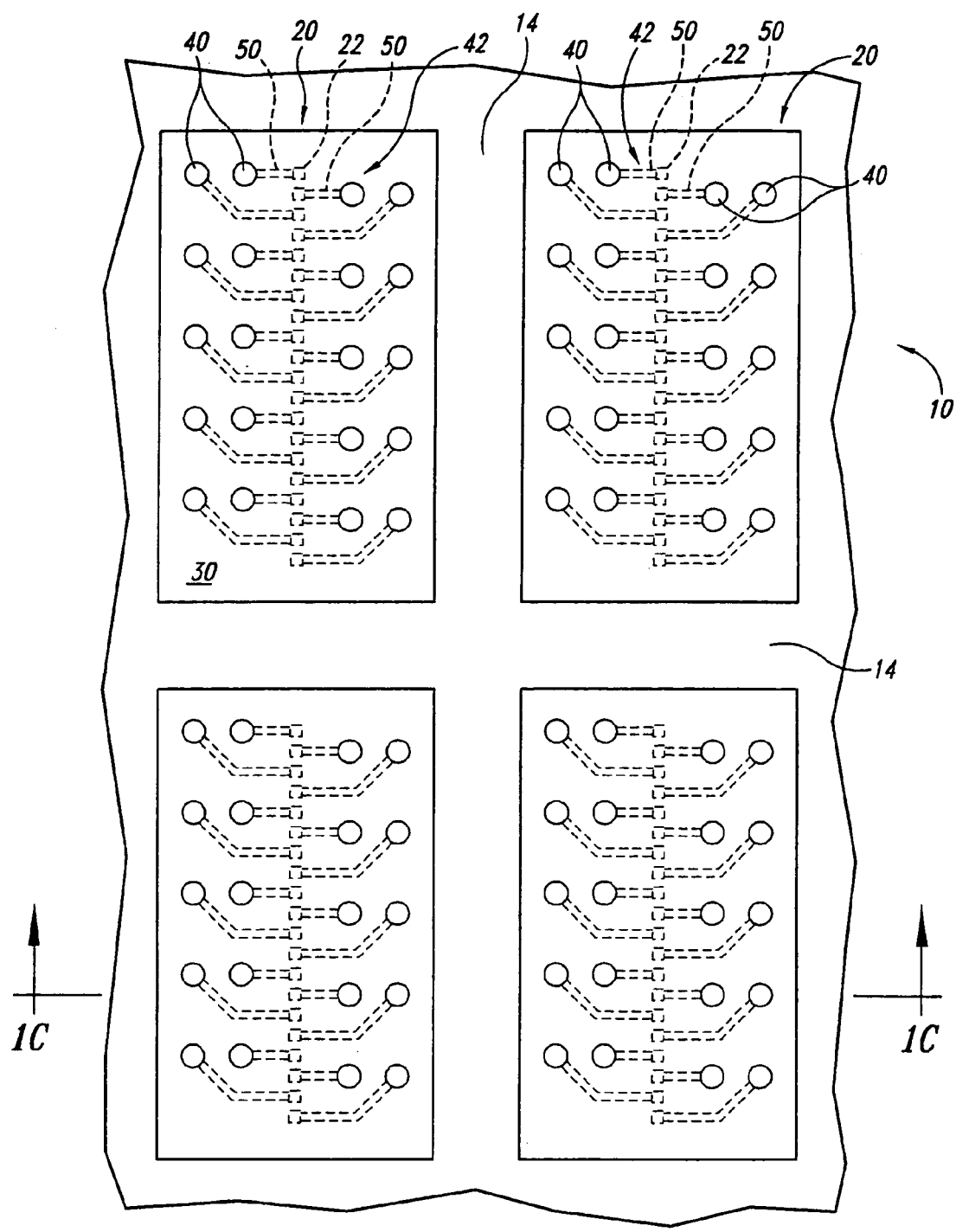
FIG. 1B is a top plan view showing a portion of the microelectronic workpiece of FIG. 1A.

A. Microelectronic Workpieces and Methods for Forming Microelectronic Workpieces FIG. 1A is a top plan view of a microelectronic workpiece 10 and FIG. 1B is a top plan view showing a detailed portion of the microelectronic workpiece 10 of FIG. 1A. FIGS. 1A and 1B, more specifically, illustrate the microelectronic workpiece 10 at one stage of using wafer-level packaging to provide ball-grid arrays for individual dies on the workpiece 10 in accordance with one embodiment of the invention.

The workpiece 10 includes a substrate 12, a plurality of scribe lanes 14, and a plurality microelectronic dies 20. The substrate 12 can be a semiconductive material that is doped or implanted with specific materials to form microelectronic components. Additional dielectric materials, conductive materials and semiconductive materials can form more components of circuits in stacks of layers on the substrate 12. The scribe lanes 14 separate the dies 20 from each other to provide spaces for cutting the workpiece 10 into individual microelectronic devices. The dies 20 can be memory devices, processors or other types of devices that include integrated circuitry. Each die 20 includes a plurality of bond-pads 22 (best shown in FIG. 1B) that are coupled to the integrated circuitry in the dies 20. The bond-pads 22 accordingly provide external contacts to provide source voltages, ground voltages and signals to the integrated circuitry in each die 20. The bond-pads 22, however, are typically so small that they cannot be attached directly to contacts on printed circuit boards or other modules in a cost-effective manner.

Figure 1C:
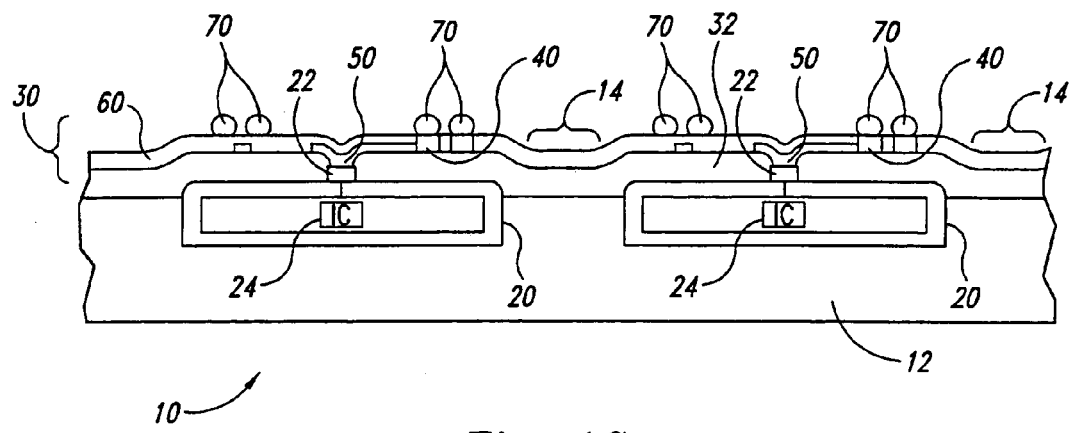
FIG. 1C is a schematic cross-sectional view of the portion of the workpiece of FIG. 1B.

The workpiece 10 also includes a redistribution layer that provides arrays of contacts for each die 20 which are larger and spaced further apart than the bond-pads 22. FIG. 1C is a schematic cross-sectional view of the workpiece 10 taken along line 1C–1C of FIG. 1B. Referring to FIG. 1C, the bond-pads 22 are coupled to the integrated circuitry 24 in each individual die 20. The workpiece 10 also includes a redistribution layer 30 having a first dielectric layer 32 over the dies 30. Referring to FIGS. 1B and 1C together, the redistribution layer 30 also includes a plurality of ball-pads 40 arranged in ball-pad arrays 42 and traces 50 coupling the ball-pads 40 to the bond-pads 22. The ball-pad arrays 42 are positioned over the dies 20 such that each ball-pad array 42 is associated with a corresponding die 20. The ball-pads 40 in a particular ball-pad array 42 are accordingly coupled to the bond-pads 22 of a corresponding die 20. Referring to FIG. 1C, the redistribution layer 30 also includes a second dielectric layer 60 that covers the traces 50 but not the ball-pads 40. A number of solder bumps or solder balls 70 are attached to the ball-pads 40.

The microelectronic device 10 shown in FIG. 1C is manufactured by fabricating the dies 20 in the substrate 12, forming the bond-pads 22 on the dies 20, and then forming the redistribution layer 30. The redistribution layer 30 is formed by depositing the first dielectric layer 32 over the dies 30 and then etching holes in the first dielectric layer 32 over the bond-pads 22. The traces 50 are then formed by depositing a metal layer over the first dielectric layer 32 and etching the pattern of traces 50 using photolithographic and etching techniques known in the art. After forming the traces 50, the second dielectric layer 60 is deposited over the first dielectric layer 32, and holes are etched in the second dielectric layer 60 to expose a distal portion of the traces 50. The ball-pads 40 are then formed by depositing a metal layer over the second dielectric layer 60 and into the holes in the second dielectric layer 60. This metal layer is then etched or planarized to form the ball-pads 40. The solder balls 70 are formed on the ball-pads 40 using stencil printing or other techniques for depositing a solder paste onto each of the individual ball-pads 40 and then reflowing the solder paste to form the solder balls 70.

The microelectronic workpiece 10 shown in FIG. 1C is suitable for final processing including cutting the workpiece 10 into single packaged microelectronic devices, testing the devices, marking the devices, and shipping the devices. The individual microelectronic devices, however, may be damaged during such procedures because the bare dies 20 are brittle and may crack or break during such handling. Moreover, small particles may be embedded in the redistribution layer 30 or lodged between the solder balls 70. Therefore, even though the microelectronic workpiece 10 is suitable for final processing at the stage shown in FIG. 1C, it would be beneficial to provide more protection to reduce the potential of damaging the microelectronic devices in subsequent handling.

B. Microelectronic Workpieces with Protective Films

Figure 2:
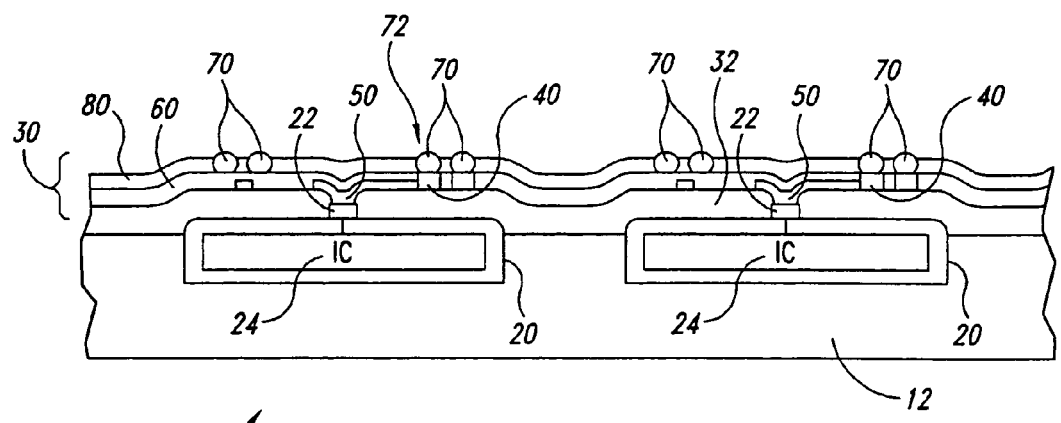
FIG. 2 is a schematic cross-sectional view showing the portion of the workpiece of FIG. 1C at a subsequent stage of the method for forming microelectronic workpieces in accordance with the invention.

FIG. 2 is a schematic cross-sectional view of the microelectronic workpiece 10 after a protective film 80 has been applied to the redistribution layer 30. The protective film 80 defines a cover that protects the redistribution layer 30 and the dies 20 from being damaged in post-packaging handling. In this embodiment, the protective film 80 covers the second dielectric layer 60 in the space between the solder balls 70. The protective film 80 also can cover a lower portion of the solder balls 70. An upper portion of the solder balls 70 can thus extend above the protective film 80. In other embodiments, a top surface of the solder balls 70 can be exposed through the protective film 80. As a result, the exposed portions of the solder balls 70 define contact sites 72 that can be engaged with electrical connectors of printed circuit boards or other devices.

The protective film 80 can be a deformable film that deforms at an application temperature so that it can conform to the second dielectric layer 60 and allow the exposed contact sites 72 of the solder balls 70 to project above the protective film 80. The protective film 80, for example, can be composed of a material that is deformable at ambient temperatures, such as approximately 60° F.–100° F., and more particularly approximately 70° F.–80° F. In other embodiments, the protective film 80 can be deformable at elevated temperatures, such as approximately 60° C. to 100° C., and more preferably approximately 60° C. to 70° C. The protective film 80 can be a B-Stage material that is semi-soft (i.e., deformable) at ambient or elevated application temperatures and is relatively tacky to stick to the second dielectric layer 60. The protective film 80 is also preferably composed of a material that can be cured or otherwise hardened at temperatures above the application temperature. For example, the protective film 80 can be composed of a material that is deformable at a temperature of approximately 60° C.–90° C., but cures to a hardened state in a relatively short period of time (e.g., 10–60 minutes) at approximately 100° C.–180° C. Suitable materials for the protective film 80 include epoxy-based materials. For example, one particularly suitable material for the protective film 80 is ABLEBOND RP 288–1 manufactured by Ablestik Company. It will be appreciated that other thermostat materials or thermoplastic materials may be used for the protective film.

The protective film 80 can have a thickness that is less than the diameter of the solder balls 70 or less than the distance that the solder balls 70 project above the second dielectric layer 60. For example, the protective film 80 has a thickness from approximately 5% to approximately 95% of the solder ball height and/or diameter. In one embodiment, the protective film 80 has a thickness approximately equal to 70%–80% of the solder ball height. The protective film 80 can be formed or otherwise applied to the workpiece 10 after the solder balls 70 have been attached to the ball-pads 40 at the wafer level. This allows the dies 20 to be "bumped" with solder balls in a more efficient process compared to "bumping" individual interposer substrates with solder balls. As explained in more detail below, the protective film 80 can be formed using several different techniques.

C. Embodiments of Applying Protective Films to Workpieces

Figure 3A:
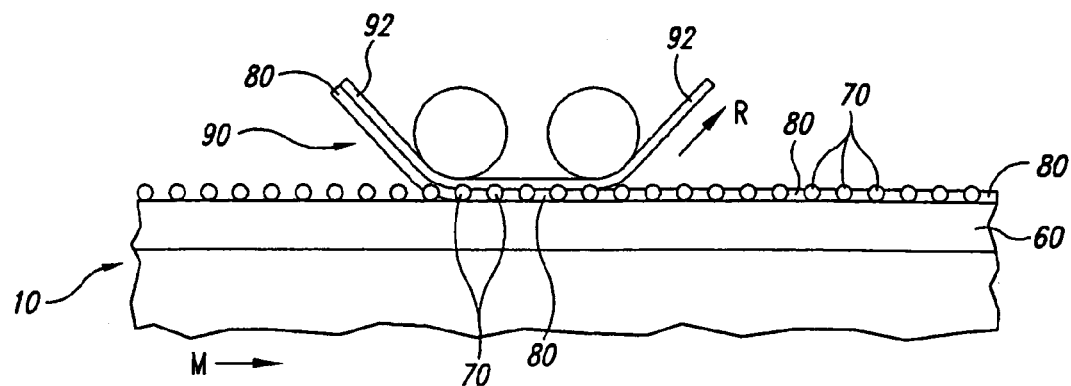
FIG. 3A is a schematic side view illustrating a workpiece of a stage of an embodiment of a method in accordance with the invention.

FIG. 3A is a schematic side elevation view of a process for forming the protective coating 80 on the workpiece 10. In this embodiment, the protective coating 80 is applied using a tape assembly having a backing medium 92 and a deformable film defining the protective coating 80. The tape assembly 90 is stretched around a plurality of rollers 95. In operation, the solder balls 70 are pressed into the protective film 80 as the workpiece and/or the tape assembly moves. For example, the workpiece 10 can move in a direction M while the tape 90 moves in a direction R. The protective film 80 deforms to fill the spaces between the solder balls 70 and adheres to the dielectric layer 60. The protective film 80 also separates from the backing medium 92. Additionally, the solder balls 70 can press into the backing medium 92 such that a top portion of the solder balls 70 is exposed through the portion of the protective film 80 as the backing medium 92 peels off of the protective film 80. It will be appreciated that some of the protective film 80 may cover the upper portions of the solder balls 70; in this case a dry etch process can be used to remove a portion of the protective film 80 and expose the upper portions of the solder balls 70.

The process for applying the protective film 80 to the workpiece 10 shown in FIG. 3A can be performed at an elevated temperature at which the material of the protective film 80 is more easily deformed by the solder balls 70 and/or is more adherent to the dielectric layer 60. Additionally, the backing medium 92 can be composed of a material that becomes less adhesive to the protective film 80 at the elevated application temperature.

Figure 3B:
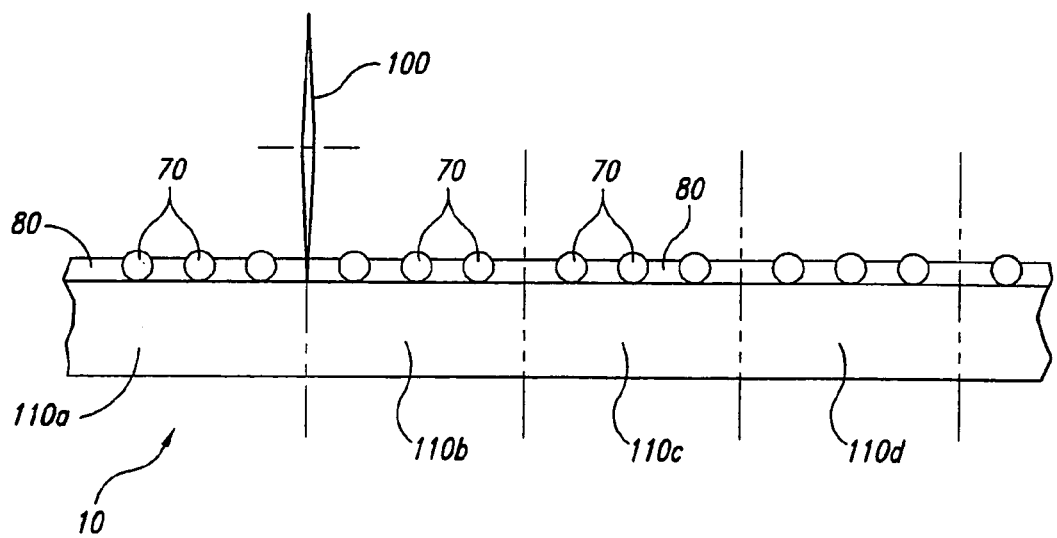
FIG. 3B is a schematic side view showing a workpiece at another stage of manufacturing microelectronic workpieces in accordance with the invention.

FIG. 3B is a schematic side elevation view of a subsequent process for forming individual microelectronic devices from the workpiece 10. In this process, a cutter 100 cuts the workpiece 10 along the scribe lanes to separate the workpiece 10 into individual microelectronic devices 110a–110d. This process is typically known as "dicing" or "singulation," and it can be performed after curing the protective film 80 to a hardened state at an elevated temperature or for a period of time at ambient temperature.

Figure 4:
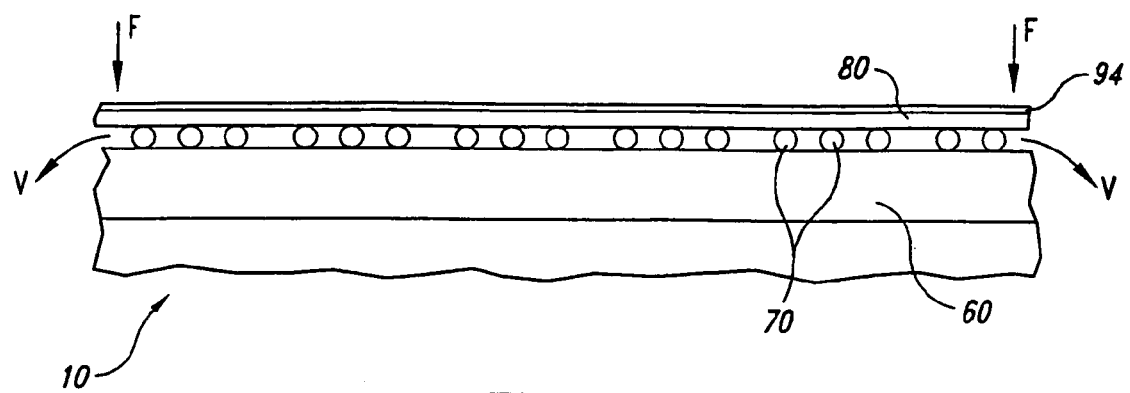
FIG. 4 is a schematic cross-sectional view illustrating a workpiece at a stage in another embodiment of a method for forming microelectronic workpieces in accordance with the invention.

FIG. 4 is a side elevation view of the workpiece 10 illustrating another embodiment of applying the protective film 80 to the second dielectric layer 60. In this embodiment, the protective film 80 can be attached to a backing sheet 94. A vacuum V can be drawn between the protective film 80 and the dielectric layer 60 to draw or suck the protective film 80 against the dielectric layer 60. In alternate embodiments, a force F can be applied to the backing sheet 94 to press the protective film 80 against the dielectric layer 60.

Several embodiments of the microelectronic workpieces are expected to provide microelectronic devices that are less susceptible to damage caused by post-packaging handling. The protective film 80 provides a cover that protects the redistribution layer 30 from particles that can be picked up from JEDEC trays, test sockets, or other equipment that is used in post-packaging handling. Additionally, the protective film 80 provides additional support for the dies 20 to reduce the likelihood of chipping or cracking. As a result, several embodiments of the microelectronic workpiece 10 with the protective film 80 are expected to reduce the number of damaged or impaired devices.

Another aspect of several embodiments of the invention described above with reference to FIGS. 1A–5B is that the protective film 80 is applied after forming the solder balls 70. As a result, the redistribution layer 30 and the solder balls 70 can be formed at the wafer level to take advantage of the ability to process all of the dies on a workpiece simultaneously. Moreover, the protective film is also applied at the wafer level which further increases the efficiency of packaging microelectronic devices.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A microelectronic workpiece for fabricating a plurality of microelectronic devices, comprising:
    a substrate having a device side and a backside;
    a plurality of dies formed on the device side of the substrate, the dies having integrated circuitry and a plurality of bond-pads electrically coupled to the integrated circuitry;
    a dielectric layer over the dies;
    a plurality of ball-pads on the dielectric layer arranged in ball-pad arrays over corresponding dies on the substrate, wherein the ball-pads of one array are electrically coupled to the bond-pads of a corresponding die;
    a plurality of solder bumps attached to the ball-pads; and
    a protective film over the dielectric layer and in contact with side portions of the solder bumps, the protective film being a semi-soft preformed press-on film having a first surface that is tacky and configured to be pressed-on to, and attached to, the dielectric layer and a second surface at least approximately opposite the first surface, the semi-soft preformed film being pressed onto the dielectric layer so that at least a portion of the solder bumps pierce the first and second surfaces of the preformed film.

2. The device of claim 1 wherein the protective film comprises a material that is deformable at a temperature of 60° F. to 100° F.

3. The device of claim 1 wherein the protective film comprises a material that is deformable at a temperature of approximately 60° C. to 90° C., and curable to a non-deformable state at approximately 140° C. to 180° C.

4. The device of claim 1 wherein the protective film comprises an epoxy.

5. The device of claim 1 wherein the solder bumps have exposed contact sites.

6. The device of claim 5 wherein the solder bumps include solder balls having a diameter and the protective film has a thickness approximately 10% to 95% of the solder ball diameter such that a portion of the solder balls projects beyond the protective coating.

7. The device of claim 1 wherein the integrated circuitry comprises a memory circuit.

8. The device of claim 1 wherein the at least a portion of the solder bumps are exposed through the preformed film.

9. The device of claim 1, further comprising a backing member removably attached to the second surface of the preformed film.

10. A semiconductor device, comprising:
    a semiconductor substrate having a device side and a backside;
    a die on the device side of the substrate, the die having integrated circuitry and a plurality of bond-pads electrically coupled to the integrated circuitry;
    a dielectric layer over the device side;
    a plurality of ball-pads arranged in a ball-pad array on the dielectric layer over the die, wherein the ball-pads are electrically coupled to corresponding bond-pads of the die;
    a plurality of solder balls attached to corresponding ball-pads, and
    a protective film over the dielectric layer and projecting above the ball-pads, the protective film being a semi-soft preformed pressed-on film having a first surface that is tacky and configured to be pressed-on to, and attached to, dielectric layer and a second surface at least approximately opposite the first surface, the semi-soft preformed film being pressed onto the dielectric layer so that at least a portion of the solder balls pierce the first and second surfaces of the preformed film.

11. The device of claim 10 wherein the protective film comprises a material that is deformable at a temperature of 60° F. to 100° F.

12. The device of claim 10 wherein the protective film comprises a material that is deformable at a temperature of approximately 60° C. to 90° C., and curable to a non-deformable state at approximately 140° C. to 180° C.

13. The device of claim 10 wherein the protective film comprises an epoxy.

14. The device of claim 10 wherein the solder balls have a diameter and the protective film has a thickness approximately 10% to 95% of the solder ball diameter such that a portion of the solder balls projects beyond the protective coating.

15. The device of claim 10 wherein the integrated circuitry comprises a memory circuit.

16. The device of claim 10 wherein the at least a portion of the solder balls are exposed through the preformed film.

17. The device of claim 10, further comprising a backing member removably attached to the second surface of the preformed film.

18. A microelectronic device, comprising:
   a substrate;
   a die formed on the substrate, the die including integrated circuitry and a plurality of bond-pads electrically coupled to the integrated circuitry;
   a plurality of ball-pads over the substrate arranged in a ball-pad array over the die, wherein the ball-pads are coupled to corresponding bond-pads of the die;
   a plurality of solder balls on the ball-pads; and
   a cover over the dielectric layer and surrounding a portion of the solder balls, the cover including a semi-soft preformed press-on film having a first surface that is tacky and configured to be pressed-on to, and attached to, the dielectric layer and a second surface at least approximately opposite the first surface, the semi-soft preformed film being pressed onto the dielectric layer so that at least a portion of the solder balls pierce the first and second surfaces of the preformed film.

19. The device of claim 18 wherein the cover comprises a material that is deformable at a temperature of 60° F. to 100° F.

20. The device of claim 18 wherein the cover comprises a material that is deformable at a temperature of approximately 60° C. to 90° C., and curable to a non-deformable state at approximately 140° C. to 180° C.

21. The device of claim 18 wherein the cover comprises an epoxy.

22. The device of claim 18 wherein the solder balls have a diameter and the cover has a thickness approximately 10% to 95% of the solder ball diameter such that a portion of the solder balls projects beyond the protective coating.

23. The device of claim 18 wherein the integrated circuitry comprises a memory circuit.

24. The device of claim 18 wherein the at least a portion of the solder balls are exposed through the preformed film.

25. The device of claim 18, further comprising a backing member removably attached to the second surface of the preformed film.

* * * * *